(12) United States Patent
Wang et al.

(10) Patent No.: US 11,821,964 B2
(45) Date of Patent: Nov. 21, 2023

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Hui-Lin Wang, Taipei (TW); Chen-Yi Weng, New Taipei (TW); Che-Wei Chang, Taichung (TW); Si-Han Tsai, Taichung (TW); Ching-Hua Hsu, Kaohsiung (TW); Jing-Yin Jhang, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 207 days.

(21) Appl. No.: 16/927,918

(22) Filed: Jul. 13, 2020

(65) Prior Publication Data
US 2021/0389394 A1 Dec. 16, 2021

(30) Foreign Application Priority Data

Jun. 16, 2020 (CN) .......................... 202010546950.X

(51) Int. Cl.
| | |
|---|---|
| *G01R 33/09* | (2006.01) |
| *G11C 11/02* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ......... *G01R 33/093* (2013.01); *G01R 33/098* (2013.01); *G11C 11/02* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC .... G01R 33/093; G01R 33/098; G11C 11/02; H01L 27/222; H01L 43/02; H01L 43/08; H01L 43/10; H01L 43/12
USPC ........................................................ 257/421
See application file for complete search history.

(56) References Cited

U.S. PATENT DOCUMENTS

| | | | |
|---|---|---|---|
| 9,269,894 B2 | 2/2016 | Mudivarthi et al. | |
| 9,472,753 B1 | 10/2016 | Katine | |
| 2004/0235205 A1* | 11/2004 | Levy | ................... G03F 7/70616 257/E21.53 |

(Continued)

FOREIGN PATENT DOCUMENTS

| | | |
|---|---|---|
| CN | 106549102 A | 3/2017 |
| CN | 110875421 A | 3/2020 |

*Primary Examiner* — Jami Valentine Miller
(74) *Attorney, Agent, or Firm* — Winston Hsu

(57) ABSTRACT

A method for fabricating semiconductor device includes the steps of first forming a magnetic tunneling junction (MTJ) stack on a substrate, in which the MTJ stack includes a pinned layer on the substrate, a barrier layer on the pinned layer, and a free layer on the barrier layer. Next, a top electrode is formed on the MTJ stack, the top electrode, the free layer, and the barrier layer are removed, a first cap layer is formed on the top electrode, the free layer, and the barrier layer, and the first cap layer and the pinned layer are removed to form a MTJ and a spacer adjacent to the MTJ.

1 Claim, 7 Drawing Sheets

(56) References Cited

U.S. PATENT DOCUMENTS

| | | | |
|---|---|---|---|
| 2006/0158792 A1* | 7/2006 | Gill | G11B 5/3912 |
| | | | 360/324.11 |
| 2007/0064350 A1* | 3/2007 | Gill | G11B 5/3906 |
| 2010/0020592 A1* | 1/2010 | Hosotani | G11C 11/161 |
| | | | 365/158 |
| 2010/0258887 A1* | 10/2010 | Zhu | H01F 10/3254 |
| | | | 257/E29.323 |
| 2013/0241075 A1* | 9/2013 | Yeh | H01L 22/12 |
| | | | 438/692 |
| 2016/0254440 A1 | 9/2016 | Wang | |
| 2017/0330806 A1* | 11/2017 | deVilliers | H01L 21/0274 |
| 2017/0358734 A1 | 12/2017 | Zheng | |
| 2018/0182443 A1* | 6/2018 | Chia | H01L 43/10 |
| 2019/0067112 A1* | 2/2019 | Liang | H01L 27/0886 |
| 2019/0157544 A1* | 5/2019 | Hsu | H01L 27/226 |
| 2019/0189910 A1* | 6/2019 | Patel | H01L 27/222 |
| 2020/0111206 A1* | 4/2020 | Yati | G06K 9/6267 |
| 2020/0395214 A1* | 12/2020 | Su | H01L 21/3086 |
| 2021/0143324 A1* | 5/2021 | Lin | H01F 41/308 |

* cited by examiner

MAGNETORESISTIVE RANDOM ACCESS MEMORY AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first forming a magnetic tunneling junction (MTJ) stack on a substrate, in which the MTJ stack includes a pinned layer on the substrate, a barrier layer on the pinned layer, and a free layer on the barrier layer. Next, a top electrode is formed on the MTJ stack, the top electrode, the free layer, and the barrier layer are removed, a first cap layer is formed on the top electrode, the free layer, and the barrier layer, and the first cap layer and the pinned layer are removed to form a MTJ and a spacer adjacent to the MTJ.

According to another aspect of the present invention, a semiconductor device includes a magnetic tunneling junction (MTJ) on a substrate, in which the MTJ includes a pinned layer on the substrate, a barrier layer on the pinned layer, and a free layer on the barrier layer. Preferably, a critical dimension of the barrier layer is different from a critical dimension of the pinned layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
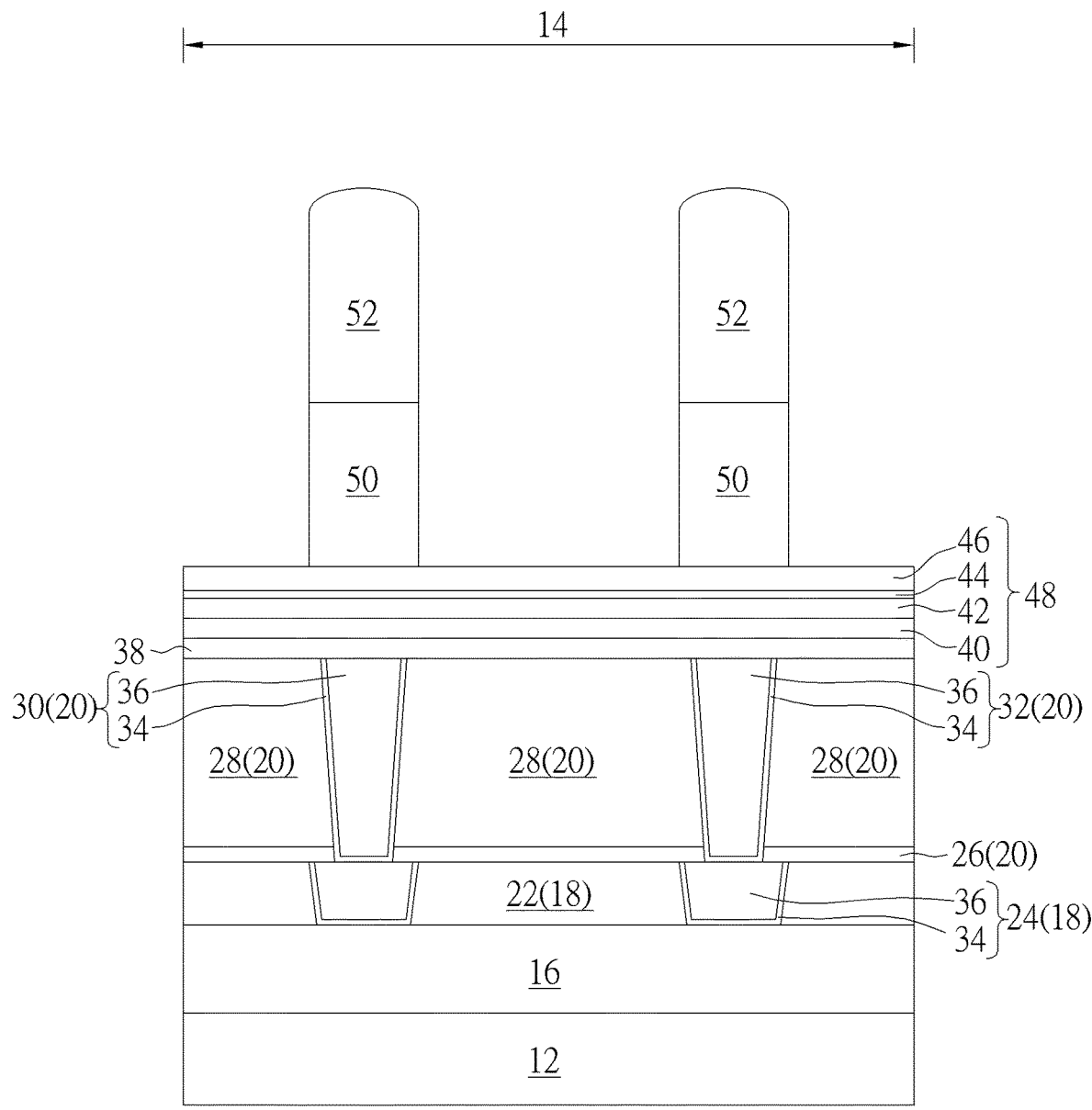
FIGS. 1-5 illustrate a method for fabricating a MRAM device according to an embodiment of the present invention.

Referring to FIGS. 1-5, FIGS. 1-5 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the IMD layer 28.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the IMD layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten, the IMD layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a bottom electrode 38 is formed on the surface of the IMD layer 28, a MTJ stack 48 including a pinned layer 40, a reference layer 42, a barrier layer 44, and a free layer 46 is formed on the bottom electrode 38, and a top electrode 50 and a hard mask 52 are formed on the MTJ stack 48. Preferably, the free layer 46 could further include a first free layer (not shown) disposed on the barrier layer 44, a stop layer (not shown) disposed on the first free layer, and a second free layer (not shown) disposed on the stop layer. Next, a photo-etching process is conducted to remove part of the hard mask 52 and part of the top electrode 50 to expose the surface of the MTJ stack 48.

In this embodiment, the bottom electrode 38 and the top electrode 50 are preferably made of conductive material including but not limited to for example Ta, Pt, Cu, Au, Al, or combination thereof. The pinned layer 40 could be made of ferromagnetic material including but not limited to for example iron, cobalt, nickel, or alloys thereof such as cobalt-iron-boron (CoFeB) or cobalt-iron (CoFe), in which the pinned layer 40 is formed to fix or limit the direction of magnetic moment of adjacent layers. The reference layer 42 is disposed between the pinned layer 40 and the barrier layer 44, in which the reference layer 42 could be made of ferromagnetic material including but not limited to for example iron, cobalt, nickel, or alloys thereof such as cobalt-iron-boron (CoFeB). The barrier layer 44 could be made of insulating material including but not limited to for example oxides such as aluminum oxide ($AlO_x$) or magnesium oxide (MgO). The free layer 46 including the first free layer and the second free layer could be made of ferromagnetic material including but not limited to for example iron, cobalt, nickel, or alloys thereof such as cobalt-iron-boron (CoFeB), in which the magnetized direction of the free layer 46 could be altered freely depending on the influence of outside magnetic field. The stop layer between the first free layer and the second free layer preferably includes tantalum (Ta) and the hard mask 52 preferably includes silicon oxide or silicon nitride.

Figure 2:
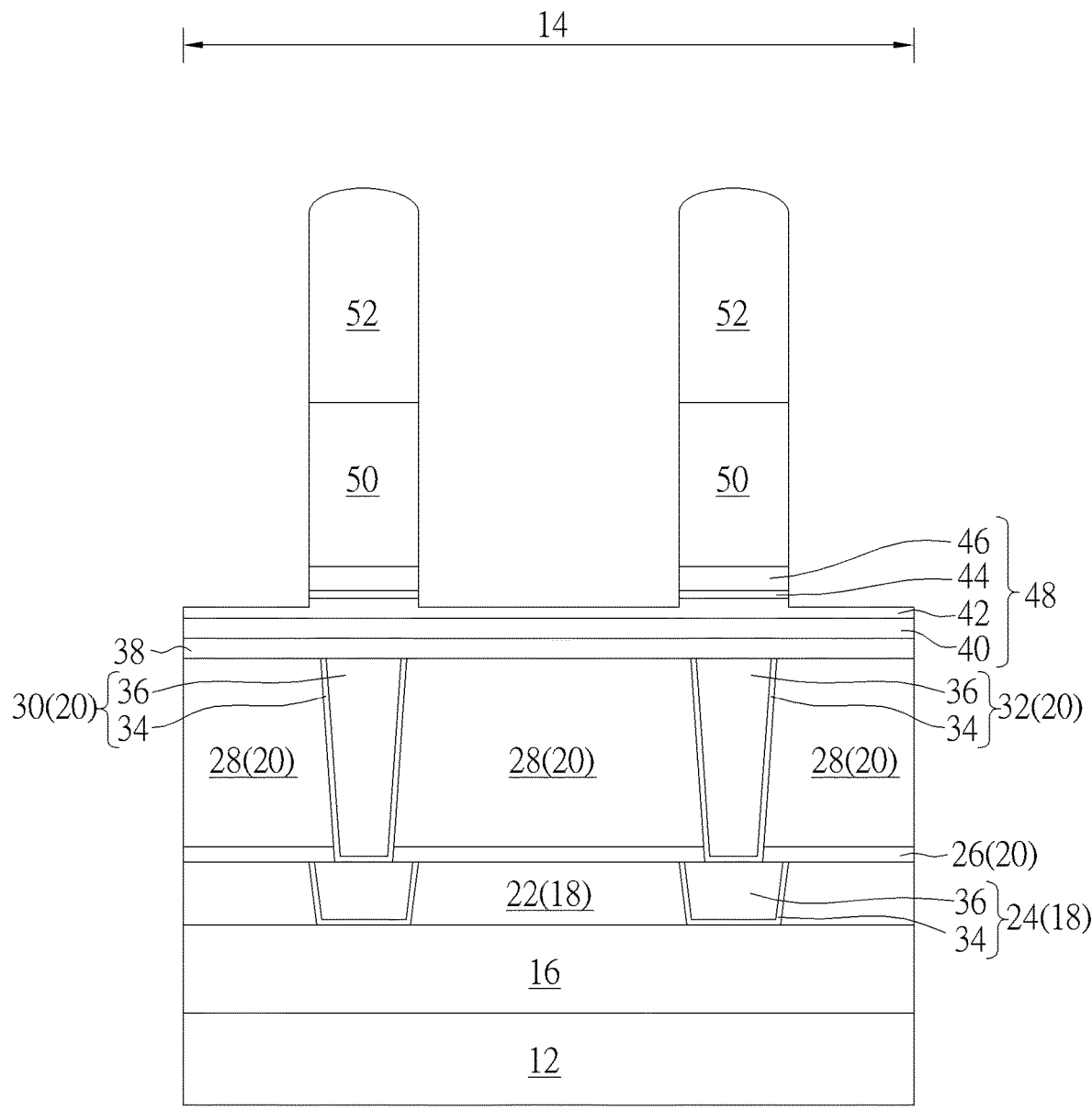

Next, as shown in FIG. 2, a pattern transfer or photo-etching process is conducted by using the patterned hard mask 52 as mask to remove part of the free layer 46, part of the barrier layer 44, and even part of the reference layer 42 to expose the surface of the remaining reference layer 42. It should be noted that even though the pattern transfer process conducted at this stage removes part of the reference layer 42 and stops on the surface of the reference layer 42, according to other embodiment of the present invention it would also be desirable to only remove part of the barrier layer 44 without removing any of the reference layer 42 so that the etching process stops on the top surface of the reference layer 42 or removes part of the barrier layer 44 and then removes part of the reference layer 42 to expose the surface of the pinned layer 40 underneath, which are all within the scope of the present invention. In this embodiment, the pattern transfer process could be accomplished by a reactive ion etching (ME) process and/or an ion beam etching (IBE) process.

Figure 3:
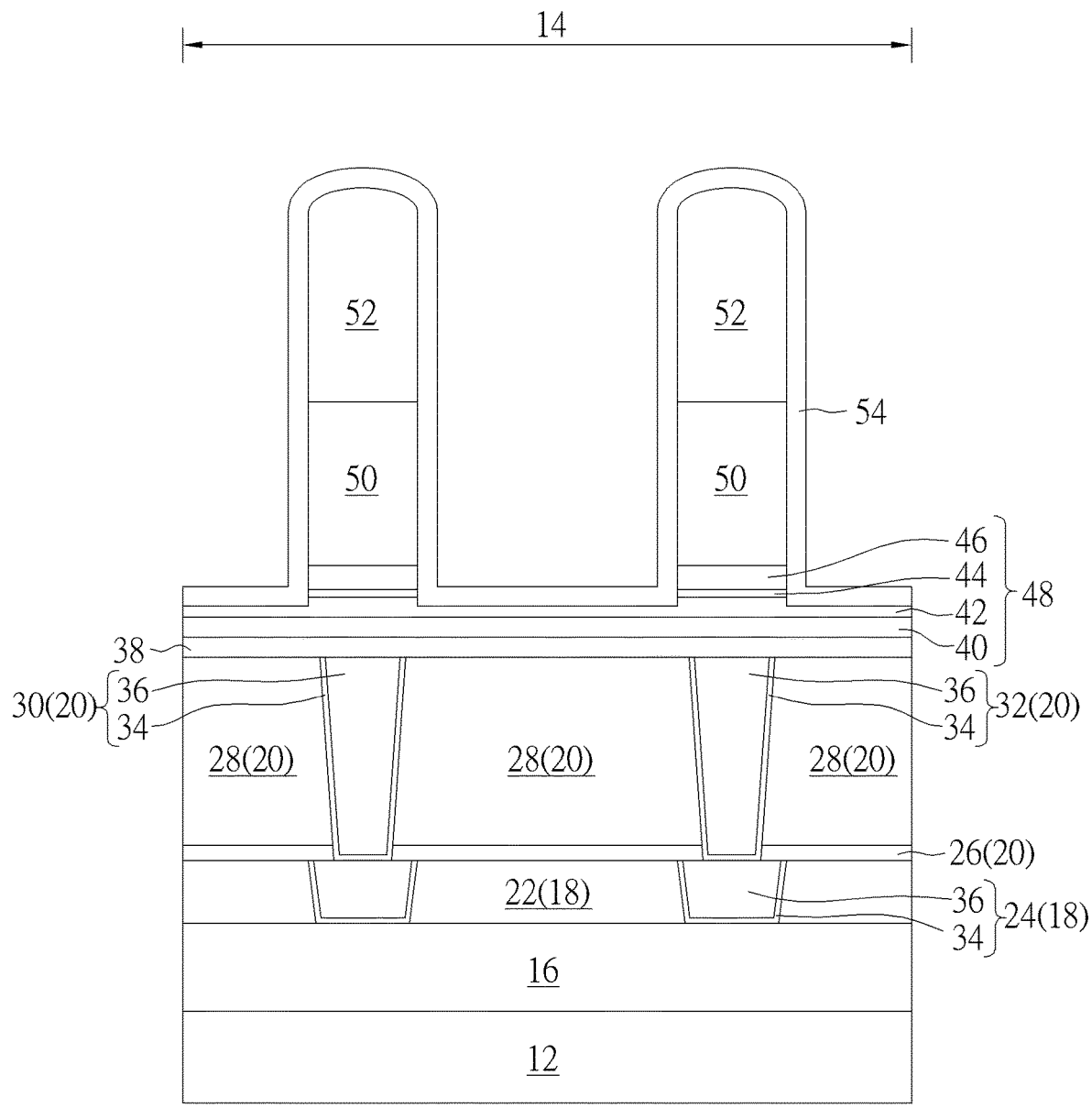

Next, as shown in FIG. 3, a cap layer 54 is formed on the hard mask 52 and the remaining MTJ stack 48, in which the cap layer 54 is conformally formed on the top surface of the hard mask 52, sidewalls of the hard mask 52, sidewalls of the top electrode 50, sidewalls of the free layer 46, sidewalls of the barrier layer 44, and sidewalls and top surface of the reference layer 42. In this embodiment, the cap layer 54 preferably includes silicon nitride, but not limited thereto.

Figure 4:
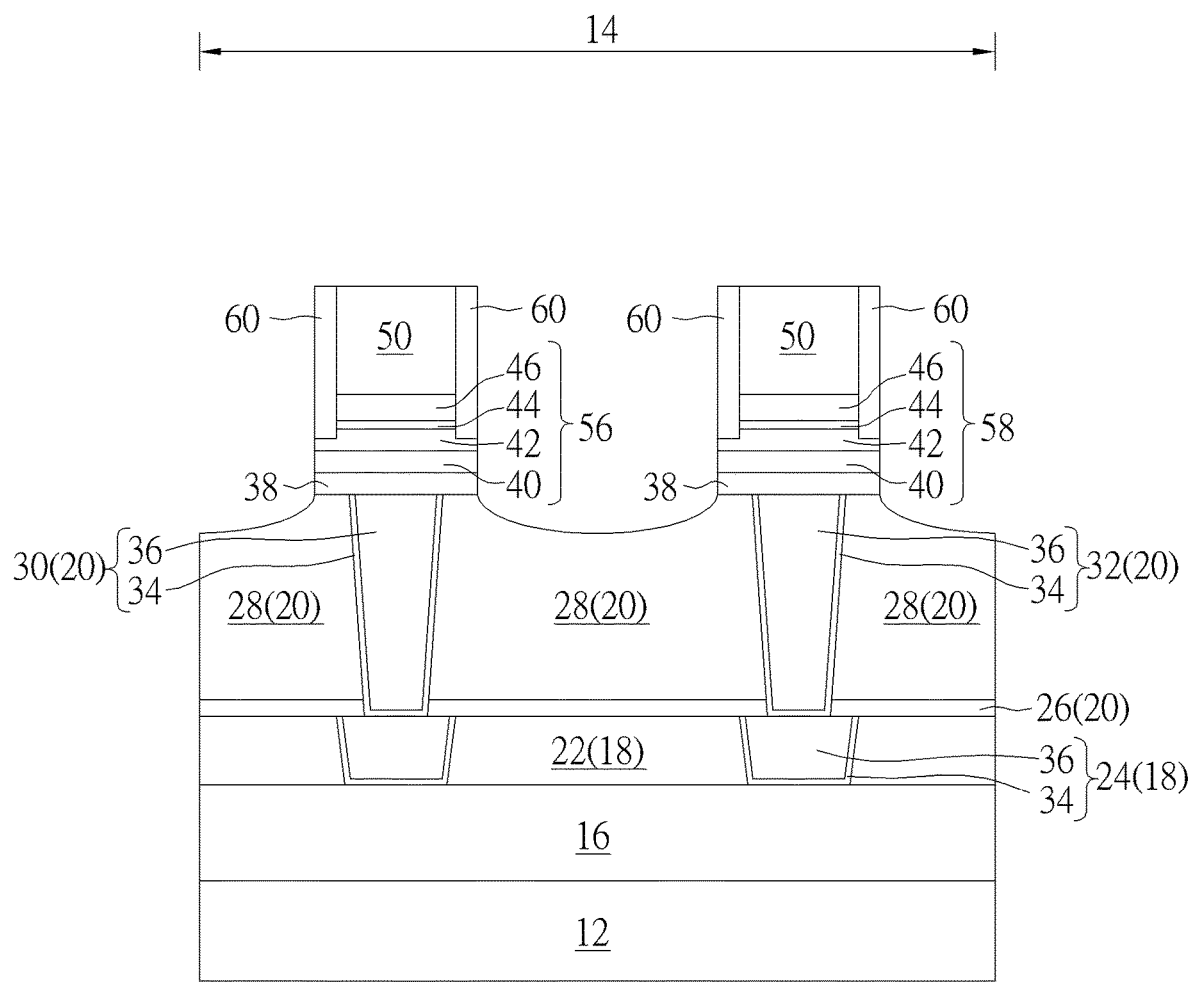

Next, as shown in FIG. 4, one or more etching process could be conducted without forming extra mask to remove part of the cap layer 54, the hard masks 52, part of the top electrodes 50, part of the reference layer 42, part of the pinned layer 40, part of the bottom electrode 38, and part of the IMD layer 28 to form a plurality of MTJs 56, 58 on the substrate 12 and at the same time form spacers 60 adjacent to the MTJs 56, 58 or more specifically adjacent to the reference layer 42, barrier layer 44, free layer 46, and top electrode 50. Preferably, each of the spacers 60 formed from the cap layer 54 includes an I-shape cross-section as sidewalls of the spacers 60 are aligned with sidewalls of the reference layer 42, pinned layer 40, and bottom electrode 38. The hard masks 52 are removed during the aforementioned etching process.

It should be noted that a reactive ion etching (ME) process and/or an ion beam etching (IBE) process could be conducted to remove part of the MTJ stack 48 and even part of the IMD layer 28 for forming the MTJs 56, 58. Due to the characteristics of the IBE process, the top surface of the remaining IMD layer 28 is slightly lower than the top surface of the metal interconnections 30, 32 after the IBE process and the top surface of the IMD layer 28 also reveals a curve or an arc.

Figure 5:
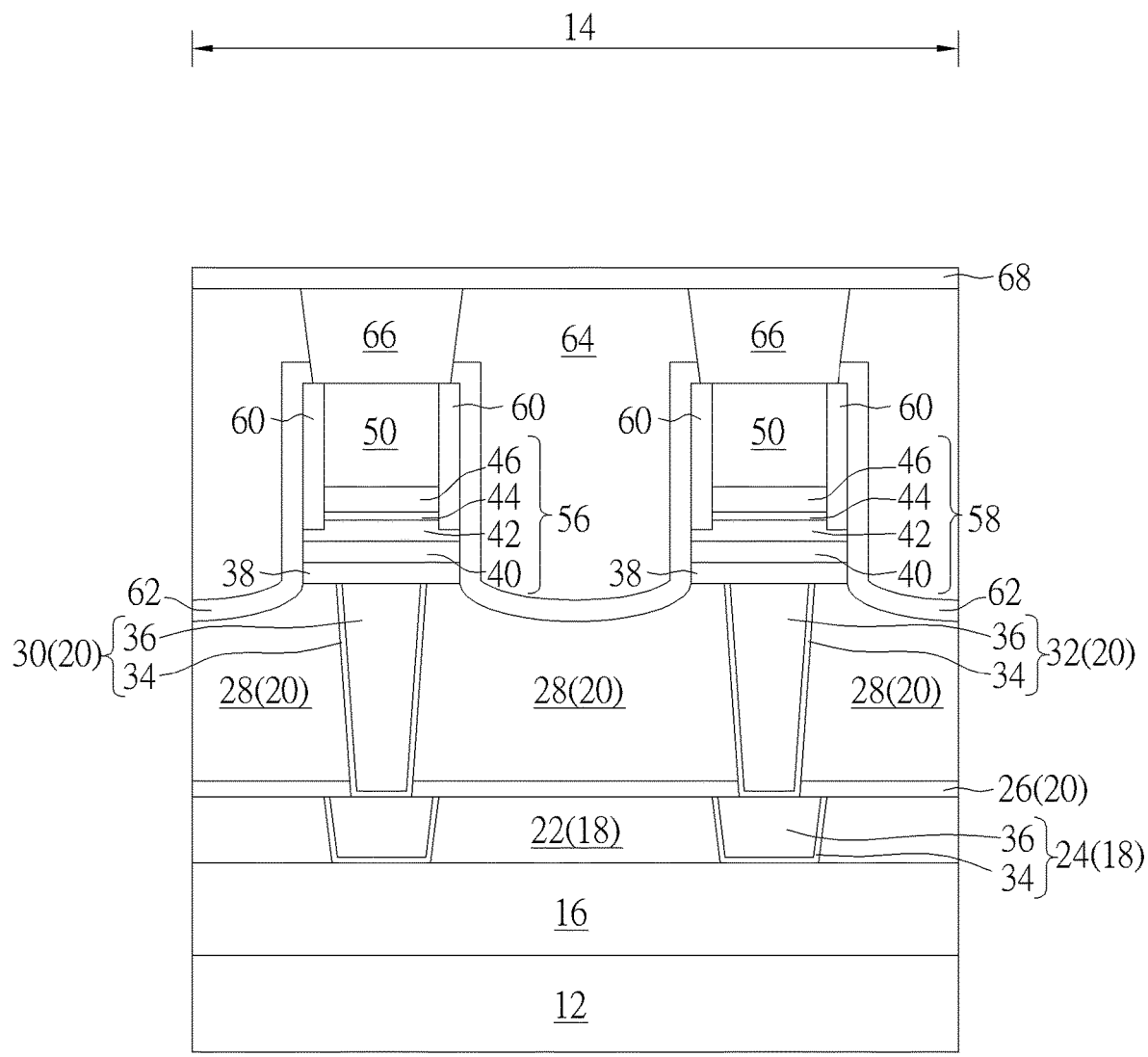

Next, as shown in FIG. 5, another cap layer 62 is formed on the MTJs 56, 58 and covering the surface of the IMD layer 28, an IMD layer 64 is formed on the cap layer 62, and one or more photo-etching process is conducted to remove part of the IMD layer 64 and part of the cap layer 62 to form contact holes (not shown) exposing the top electrodes 50. Next, conductive materials are deposited into the contact holes and planarizing process such as CMP is conducted to form metal interconnections 66 connecting the top electrodes 50 underneath. Next, another stop layer 68 is formed on the IMD layer 58 and covering the metal interconnections 66.

In this embodiment, the cap layer 62 preferably includes silicon nitride, but could also include other dielectric material including but not limited to for example silicon oxide, silicon oxynitride (SiON), or SiCN depending on the demand of the product. Preferably, the cap layer 62 and the spacers 60 are made of different materials, in which the cap layer 62 includes higher concentration of silicon ions than the spacers 60 thereby constituting a silicon-rich layer. The stop layer 68 could include nitrogen doped carbide (NDC), silicon nitride, silicon carbon nitride (SiCN), and most preferably SiCN. Similar to the aforementioned metal interconnections, each of the metal interconnections 66 could be formed in the IMD layer 64 according to a single damascene process or dual damascene process. For instance, each of the metal interconnections 66 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device includes at least a MTJ such as MTJ 56 disposed on the substrate 12, a bottom electrode 38 disposed under the MTJ 56, a top electrode 50 disposed on top of the MTJ 56, and spacers 60 adjacent to the sidewalls of the MTJ 56, in which the MTJ 56 includes a pinned layer 40, a reference layer 42 on the pinned layer 40, a barrier layer 44 on the reference layer 42, and a free layer 46 on the barrier layer 44. Preferably, the critical dimension of the barrier layer 44 is different form the critical dimension of the pinned layer 40.

Viewing from a more detailed perspective, the width of the top electrode 50 is preferably equal to the width of the free layer 46, the width of the free layer 46 is equal to the width of the barrier layer 44, the width of the barrier layer 44 is equal to or less than the width of the reference layer 42, the width of each one of the free layer 46 and barrier layer 44 is less than the width of the pinned layer 40, and the width of the reference layer 42 could be less than or equal to the width of the pinned layer 40. The spacer 60 is disposed on and directly contacting the sidewalls of the top electrode 50, free layer 46, barrier layer 44, and part of the reference layer 42, the sidewalls of the spacer 60 are aligned with sidewalls of the reference layer 42 and pinned layer 40, the top surfaces of the spacer 60 and top electrode 50 are coplanar, and the bottom surface of the spacer 60 is lower than the bottom surface of the barrier layer 44.

Figure 6:
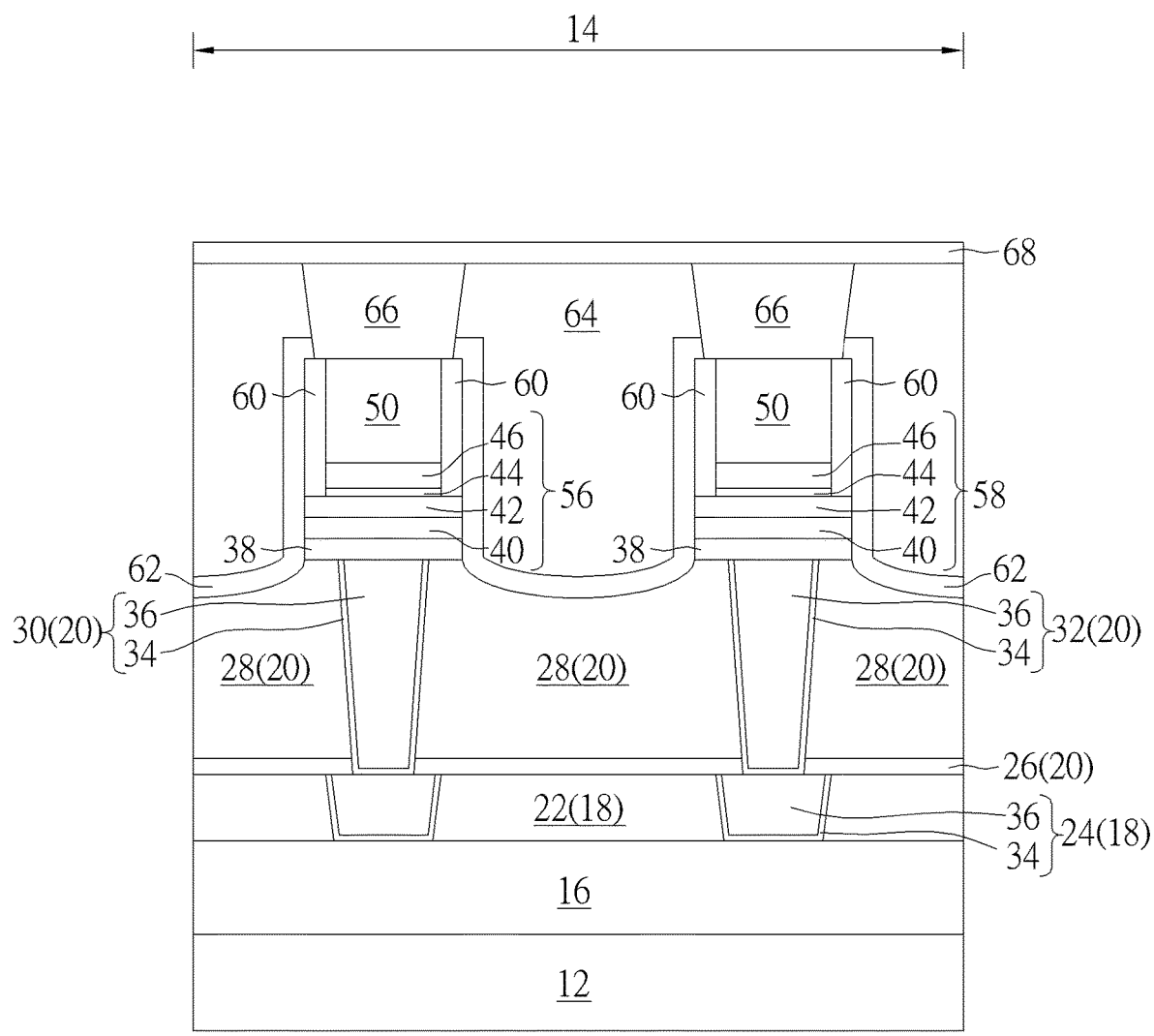
FIG. 6 illustrates a structural view of a MRAM device according to an embodiment of the present invention.

It should be noted that even though the reference layer 42 includes different thicknesses in this embodiment, according to another embodiment of the present invention as shown in FIG. 6, it would also be desirable to remove part of the barrier layer 44 without removing any of the reference layer 42 and stop on the top surface of the reference layer 42 during the etching process conducted in FIG. 2 so that the barrier layer 44 and the reference layer 42 would have different widths, the sidewalls of the spacer 60 would still be aligned with sidewalls of the reference layer 42 and pinned layer 40, and the bottom of the spacer 60 would be even with the bottom surface of the barrier layer 44.

Figure 7:
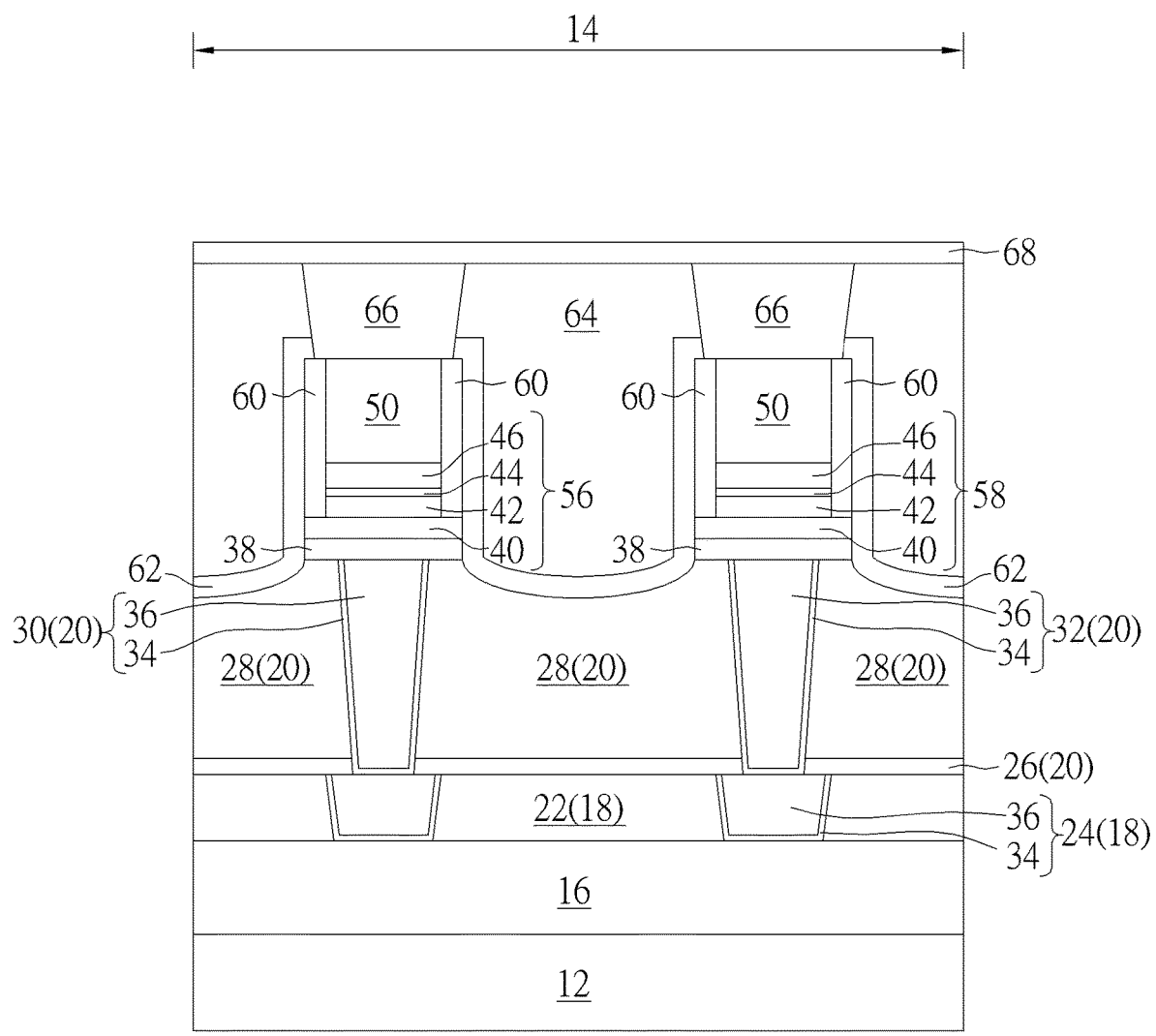
FIG. 7 illustrates a structural view of a MRAM device according to an embodiment of the present invention.

Next, as shown in FIG. 7, according to yet another embodiment of the present invention, it would also be desirable to remove the reference layer 42 and expose the surface of the pinned layer 40 underneath during the etching process conducted in FIG. 2 so that the barrier layer 44 and the reference layer 42 would share equal widths, the sidewalls of the spacer 60 would only align with the sidewall of the pinned layer 40, the bottom surface of the spacer 60 is even with the bottom surface of the reference layer 42, and the bottom surface of the spacer 60 contacts the pinned layer 40 directly, which is also within the scope of the present invention.

In current fabrication of MRAM devices, etching processes such as IBE is often employed to pattern a MTJ stack made of pinned layer, reference layer, barrier layer, and free layer for forming MTJs. The IBE process conducted however often generates metal impurities and sputtering of these metal impurities onto sidewalls of the MTJs in particular the sidewalls of the barrier layer often affects operation of the device substantially. To resolve this issue the present invention preferably defines the pattern of the free layer and barrier layer during patterning of the MTJ stack and then forms a spacer on sidewalls of the free layer and the barrier layer. By using the spacer as protection it would be desirable to prevent metal ions generated during IBE process from contacting the barrier layer of MTJ directly and affecting the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
    a magnetic tunneling junction (MTJ) on a substrate, wherein the MTJ comprises:
        a pinned layer on the substrate;
        a barrier layer on the pinned layer;
        a free layer on the barrier layer, wherein a width of the barrier layer is different from a width of the pinned layer and equal to a width of the free layer;
    a spacer adjacent to the barrier layer and the free layer, wherein the spacer comprises an upper case I-shape and a sidewall of the spacer is aligned with a sidewall of the pinned layer; and
    a cap layer adjacent to the spacer and the pinned layer.

* * * * *